(12) United States Patent
Leiter et al.

(10) Patent No.: US 6,271,471 B1
(45) Date of Patent: Aug. 7, 2001

(54) HOUSING FOR ELECTRONIC COMPONENT, AND METHOD OF PRODUCING THE SAME

(75) Inventors: Manfred Leiter, Stuttgart; Kurt Weiblen, Metzingen; Bernhard Lucas, Besigheim; Frank Schatz, Kornwestheim; Thomas Beez, Weinsberg; Juergen Seiz, Welzheim; Helmut Baumann, Gomaringen; Herbert Olbrich, Rutesheim; Heinz Eisenschmid, Stuttgart; Eberhard Moess, Murrhardt; Joachim Dutzi, Weissach; Andreas Kugler, Alfdorf, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/453,267

(22) Filed: Dec. 2, 1999

(30) Foreign Application Priority Data

Dec. 7, 1998 (DE) .............................................. 198 56 332

(51) Int. Cl.⁷ ...................................................... H02G 3/14
(52) U.S. Cl. ................................................ 174/66; 174/67
(58) Field of Search ................................ 174/67, 66, 250; 220/241, 242, 3.8; 331/107 R

(56) References Cited

U.S. PATENT DOCUMENTS

| | | | |
|---|---|---|---|
| 5,751,101 | * | 5/1998 | Takanobu et al. .................... 313/405 |
| 6,057,797 | * | 5/2000 | Wagner ................................. 342/70 |
| 6,091,037 | * | 7/2000 | Bachschmid ........................... 174/66 |

* cited by examiner

Primary Examiner—Dean A. Reichard
Assistant Examiner—Angel R. Estrada
(74) Attorney, Agent, or Firm—Michael J. Striker

(57) ABSTRACT

A housing for an electronic component has a bottom part, a wall part, a cover part which together are adapted to cover the electronic component, a contact spring provided on the cover part for producing an electrical connection with a terminal of the component, the cover part and the contact spring being formed as a one-piece integral element.

18 Claims, 6 Drawing Sheets

HOUSING FOR ELECTRONIC COMPONENT, AND METHOD OF PRODUCING THE SAME

BACKGROUND OF THE INVENTION

The present invention relates to a housing for an electric component, such as a Gunn element, which is formed so as to surround electronic component.

For a distance radar in motor vehicles (ACC-adaptive cruise control) radar waves are used with frequencies about 50 gigahertz. For producing of these radar waves Gunn elements are utilized. They are composed of III-V-semiconductor material, such as GaAs or InP and produce a high frequency electromagnetic wave when a direct current is applied. The Gunn element has for example a diameter of 70 $\mu$m and a thickness of 10 $\mu$m and is contacted on its upper and lower side.

The typical construction of a Gunn oscillator is schematically shown in FIG. 5. A Gunn element accommodated in a housing 12 is arranged on an oscillator block 16 with integrated rectangular hollow conductors, and contacts with a direct current conductor 17 with HF choke and resonator disks. A frequency tuning pin 18 serves for the frequency tuning, while the power control is performed through a hollow conductor-short circuit slider 19.

The Gunn element is shown in FIG. 6a. The housing 12 of the Gunn element is located on a socket 9 of copper, which serves for the heat withdrawal and contacting of the contacts of the Gunn element. The housing 12 has a centering disk 11 of a conductive material, and the Gunn element abuts on it by means of a gold disk 2. A ceramic ring 4 is arranged around the centering disk 11 and isolates the socket 9 from the metallic cove 6. As mentioned, the element 1 contacts at the upper and lower side. While the lower side directly abuts on the gold disk 2 and is in contact with it, the connection to the conductive cover 6 is formed by a cross-shaped gold foil (Maltese cross 15). The gold foil is bonded in the center to the back contact of the component and at the edge of the upper metalization of the ceramic ring 4 which is in contact with the cover 6. By soldering of the cover 6 of metalized ceramics, a component 1 is hermetically closed in the housing 12.

Because of an intense heating, the Gunn element is subjected to a strong thermal expansion, for example shrinkage. This leads to a relative movement between the back side of the Gunn element 11 shown above in FIG. 6 and the cover 6. During a long term operation, this can lead to loosening of the bond contact, which is especially undesirable in components which operate for the vehicle safety.

Furthermore, the manufacture of the housing is expensive and complicated, in particular because of the bond process.

SUMMARY OF THE INVENTION

Accordingly, it is an object of the present invention to provide a housing for an electronic component, which avoids the disadvantages of the prior art.

In keeping with these objects and with others which will become apparent hereinafter, one feature of present invention resides, briefly stated, in a housing for an electronic component which has a bottom part, a wall part, and a cover part surrounding the electronic component, wherein on the cover part a contact spring for producing an electrical connection with a terminal of the component is applied, and the cover part and the contact spring are formed of one piece with one another.

The contact spring compensates for thermal movements between the contact surface of the diode and the cover part, which occur during the operation of the electronic component, and provide a reliable contacting of the electronic component. Since the contact spring and the cover part are formed as a one-piece element, the contact during applying of the cover part for closing of the housing is self adjusted. The bonding process is therefore dispensed with, and the manufacturing process is simplified.

In accordance with a preferable embodiment of the present invention, the cover part and the contact spring are formed by a galvanic metal deposition. This process makes possible smaller dimensions of the contact spring, which because of the small dimensions of the electronic component provide a great spring path.

Preferably, the contact spring at the side facing the component is provided with a contact seal, for example of gold. This makes possible a reliable contact with the component.

The contact spring preferably has at least two elastic spring arms. Therefore, the shape of a torsion spring can be formed.

In accordance with a preferable embodiment, the spring force of the contact spring is dimensioned so that a reliable contacting of the electronic component is guaranteed over its whole service life. For this purpose the contact spring can be formed so that a one-time plastic deformation, for example during the mounting of the housing, is possible. The contact spring is composed of an elastic material, for example nickel or nickel alloy. Alternatively, the cover part of the contact spring can be composed completely of nickel or a nickel alloy, and provided with an oxidation protection in form of a gold layer having a thickness of approximately 2 $\mu$m.

The contact spring is arranged preferably on the cover part so that during closing of the housing by the cover part, the electronic component is automatically contacted.

In accordance with another embodiment, the housing can be also formed so that the electronic component is hermetically closed.

The bottom part of the housing can be arranged on a copper socket which serves for the electrical contacting and the heat withdrawal. The electronic component can be arranged on the bottom part with interposition of a spacer of gold.

In accordance with a further preferable variant of the invention, the wall part of the housing is formed as a ceramic ring. The wall part and the cover part can be formed of a material with corresponding thermal expansion coefficients.

The contact springs can be mounted on the cover part by galvanically deposited columns, which also can be connected with the cover part through a socket.

The invention provides further a method of producing a contact plate for electronic component, with a contact spring for producing an electrical connection with a terminal of the component, wherein the contact plate and the contact spring are galvanically deposited one after the other in a process by means of a photo-lithographic structuring.

The novel features which are considered as characteristic for the present invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 6a is a view showing a housing for a Gunn oscillator in accordance with the prior art; and FIG. 6b is a view showing a detail of FIG. 6a.

DESCRIPTION OF PREFERRED EMBODIMENTS

Figure 1:
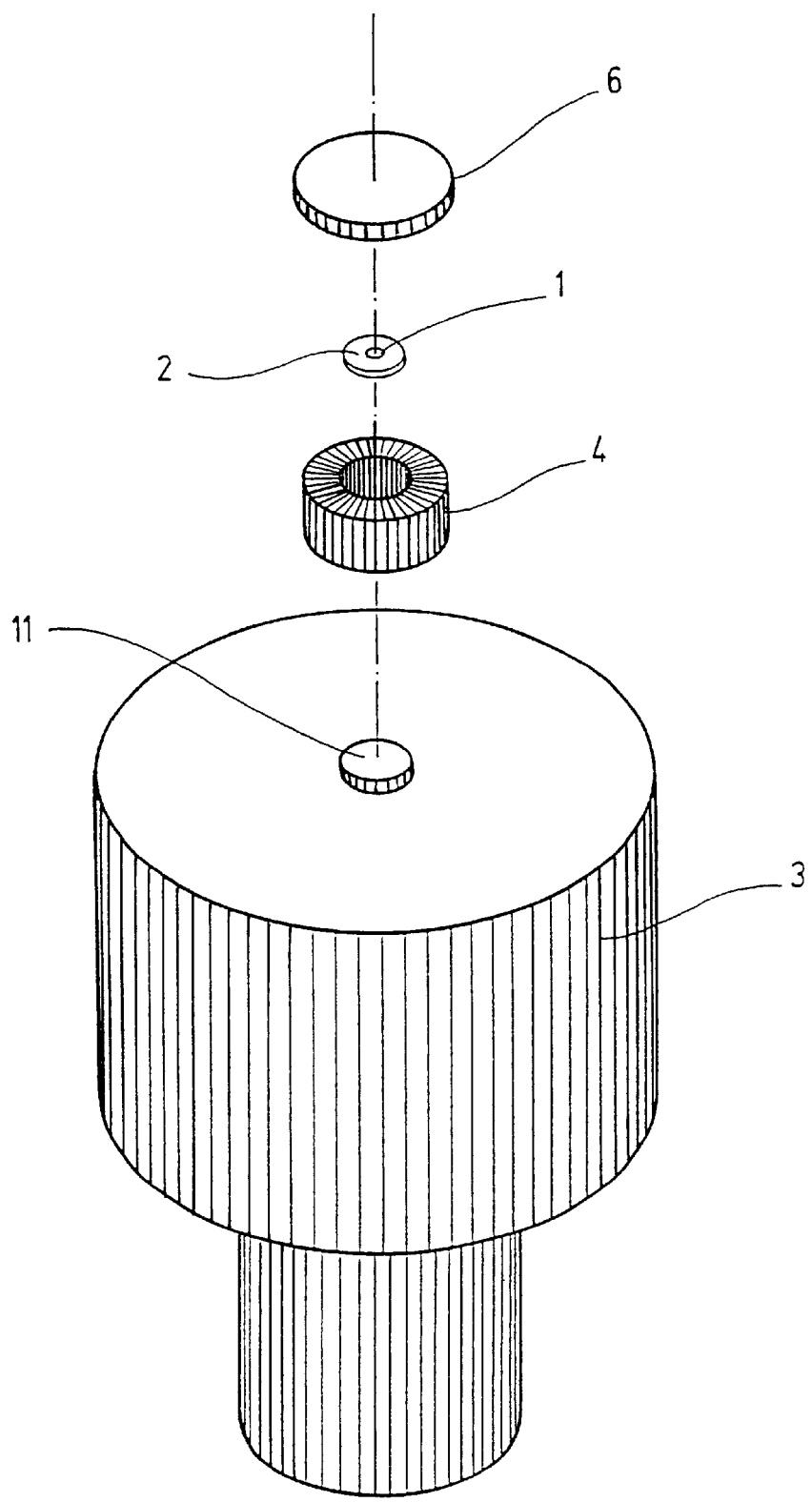
FIG. 1 is a schematic explosion view of substantial parts of the inventive housing for an electronic component.

FIG. 1 shows an explosion view of one embodiment of an inventive housing for an electronic component.

The housing surrounds the electronic component 1 for example a Gunn element, completely. It is composed of a cover part 6, a wall part 4, and a bottom part. The bottom part in the embodiment shown in FIG. 1 is formed by a copper socket 3 and a centering disk 11, on which the electronic component 1 lies. Between the centering disk 11 and the component 1, a spacer 2 composed for example of gold can be provided. The spacer 2, the centering disk 11 and the copper socket 3 serve both for the current supply of the lower contact of the component 1, and also for withdrawal of heat.

The copper socket 3 is identified as a heat sink, and it is not absolutely necessary for the invention. The wall part 4 is formed by a ceramic ring which is centered by the centering disk 11. The housing is covered by the cover part 6 which is fixed on the ceramic ring, for example by glueing.

Figure 2:
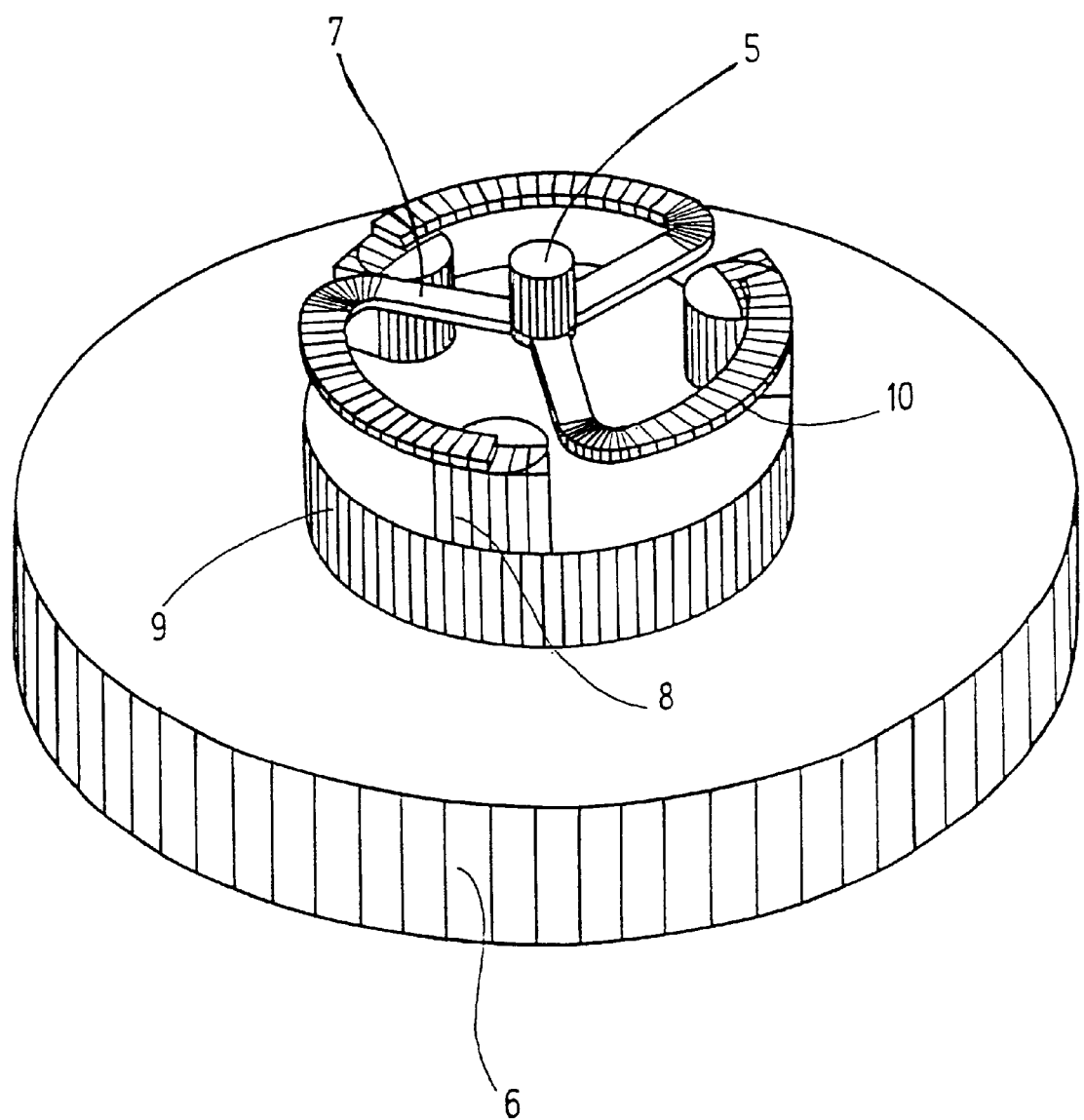
FIG. 2 is a perspective view of a cover part and a contact spring of a first embodiment of the inventive housing.
Figure 3:
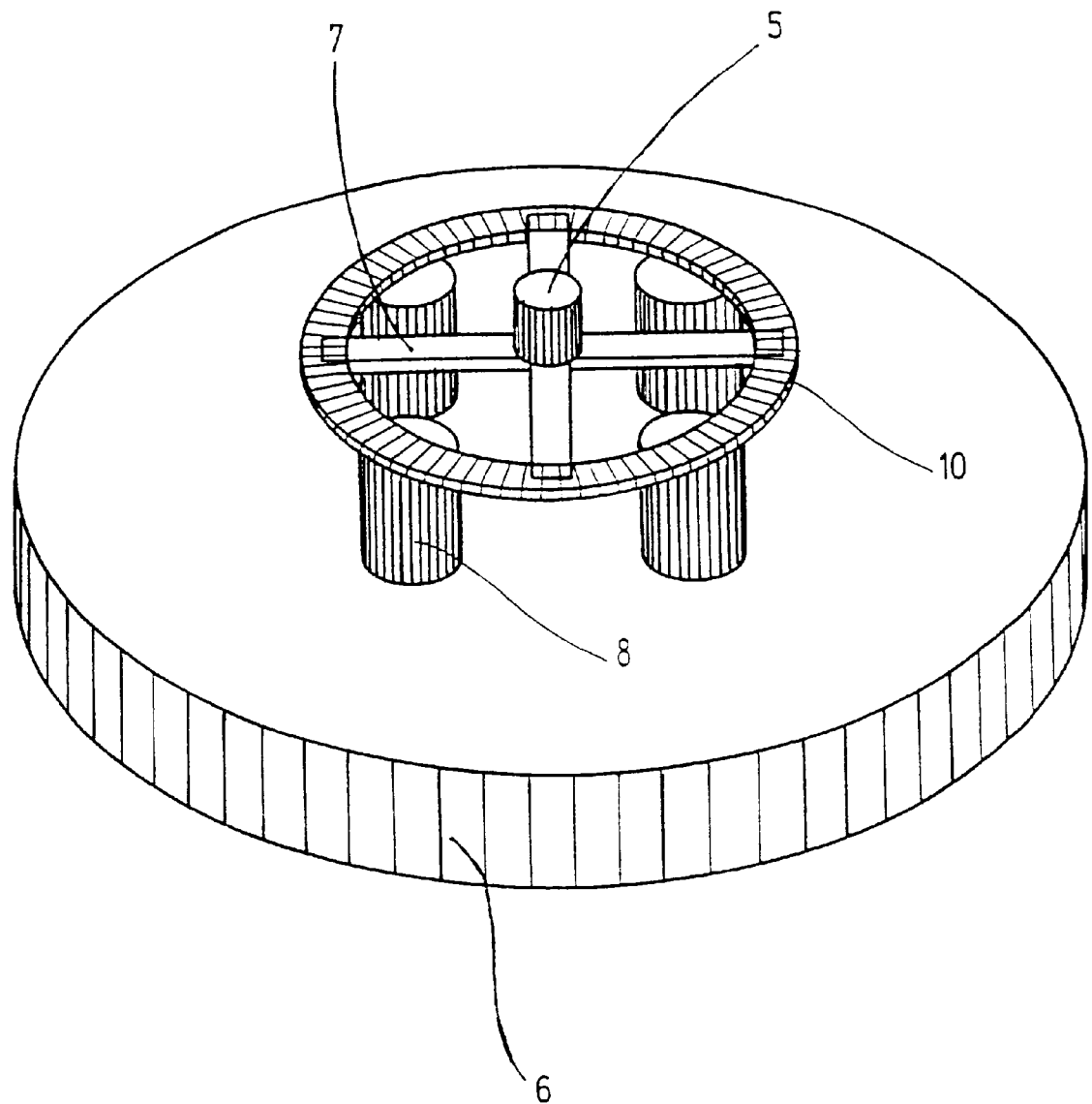
FIG. 3 is a perspective view of the cover part and the contact spring in accordance with the second embodiment of the present invention.

As shown in FIGS. 2 and 3, the cover part 6 at its side facing the component 1 has a contact spring 7 for contacting of a further contact arranged on the upper side of the electronic component. Preferably, at the tip of the spring 7, a contact seal 5 is provided of a suitable material, such as gold or the like, which produces the contact with the terminal of the component 1. It is also possible to provide the cover part and the contact spring 7 with a gold coating. The contact spring 7 is formed by a plurality of spring arms 10 which are mounted on columns 8.

In the embodiment shown in FIGS. 2 the columns 8 are arranged on a socket 9 while the socket in the embodiment of FIG. 3 is dispensed with. It is important that the cover part 6 as well as the whole spring construction are formed of one piece with one another, whereby a self-adjusting joining process is possible. The contact spring 7 and the cover part 6 have a very small tolerance with respect to the concentricity. During joining of the cover to the wall part or the ceramic ring 4, the contact spring 7 is adjusted automatically correctly to the terminal contact of the component. Thereby the expensive and error-susceptible bonding process is dispensed with. Since the electrical contact through the spring action of the contact spring is produced, a great contact safety is guaranteed also in the cases of frequent thermal expansion and shrinkage processes, in particular in impulse operation.

The cover part 6 with integrated contact spring 7 is produced preferably by galvanic metal deposition in a single process. For this purpose, several metal layers of different materials are deposited on a substrate of metal, silirium, glass, or ceramic. The structuring of the metal layers is performed as in the microelectronic processes layer-by-layer by UV depth lithography. A light-sensitive photo resist is applied by means of a mask which forms the desired structure of the respective layer, illuminated and developed. Thereby the metal structure is formed on the photo resist. The photo resist structure forms a negative structure for the later metal structure. The produced photo resist gaps are filled by galvanic metal deposition so that again a plane surface is formed which serves as a base for the next layer. For each layer, depending on the function, another material can be used. Thereby with the galvanic process a fixed connection of the materials is guaranteed. When the desired number of the layers is applied, the remaining photo resist is released from the metal structure. This can be performed for example by a KOH treatment or by an oxygen plasma, by means of solvents. Thereby, undercut structures are produced and it is guaranteed that no hollow space which are unaccessible from outside remain in the metal material. Details of the galvanic metal deposition process are disclosed for example in the German patent document DE 19 607 288 A1.

The contact springs produced micro mechanically by galvanic deposition make possible a great spring path with very small outer dimensions, which can not be realized by classic fine treatment methods. A further advantage is that the galvanic deposition of the metal in several planes is performed, and for different planes, different materials can be used. For example the spring can be composed of a high-great spring material, such as a nickel or nickel alloy, the contact seal can be composed of gold, and(the cover can be composed of a metal alloy whose thermal expansion coefficient is adjusted to the side wall) Moreover, with this method, a plurality of cover parts with integrated contact springs are produced simultaneously, and the manufacturing process as a whole is therefore less expensive.

Figure 4:
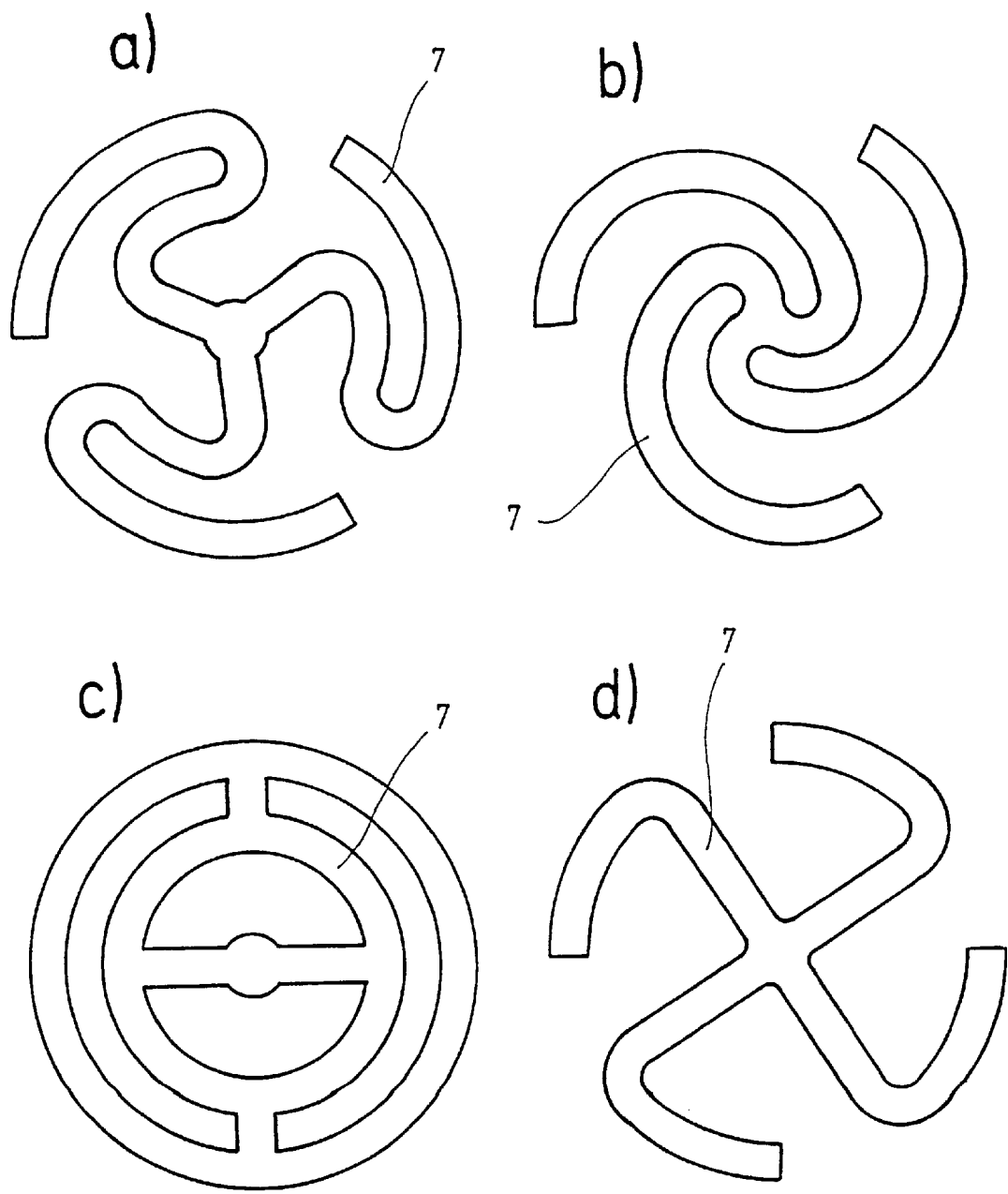
FIG. 4 is view showing various geometries of the spring arm in accordance with the present invention.

Various geometries can be recommended for the spring arms 10. FIG. 2 shows the contact springs 7 which is formed for example by three spring arms 10, to form a torsion spring. In the embodiment shown in FIG. 3, four cross-like spring arms are provided, which are mounted on a ring. FIG. 4 shows a view of further possible geometries of the spring arms.

Figure 5:
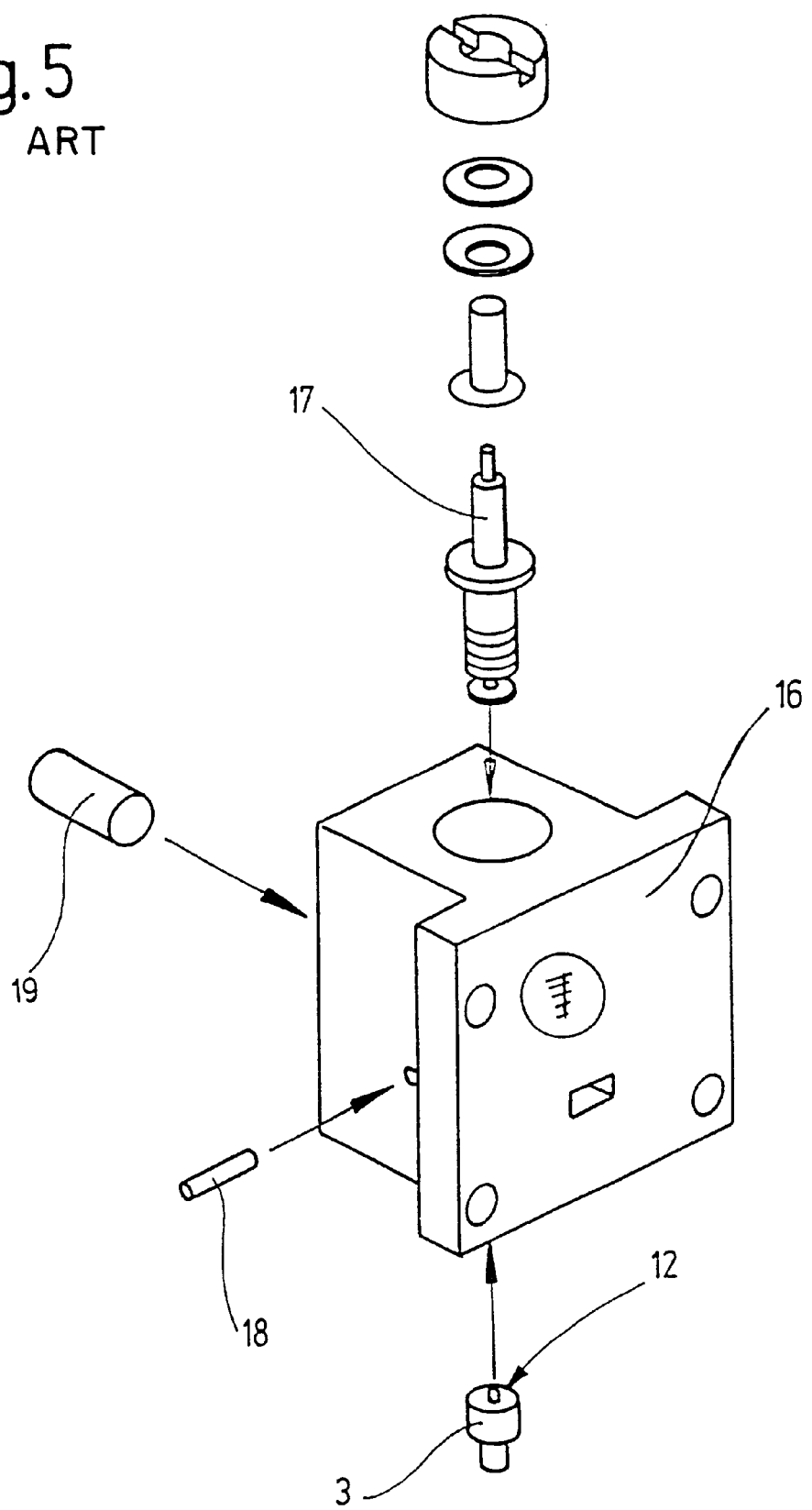
FIG. 5 is a schematic explosion view of a Gunn oscillator as the electronic component.
Figure 6:
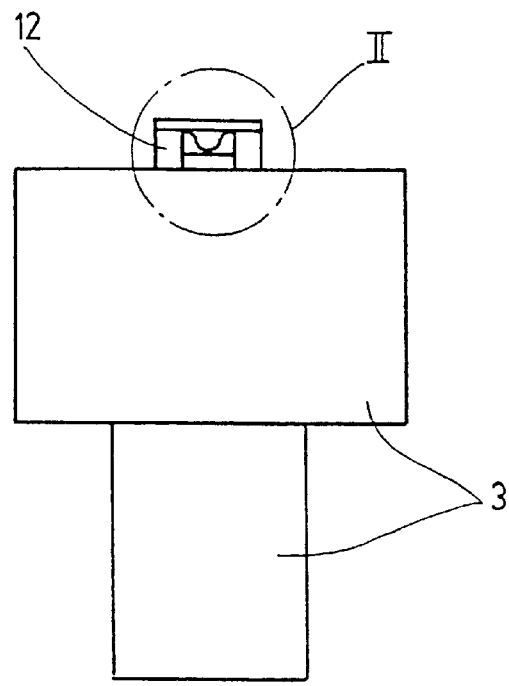
Figure 6:
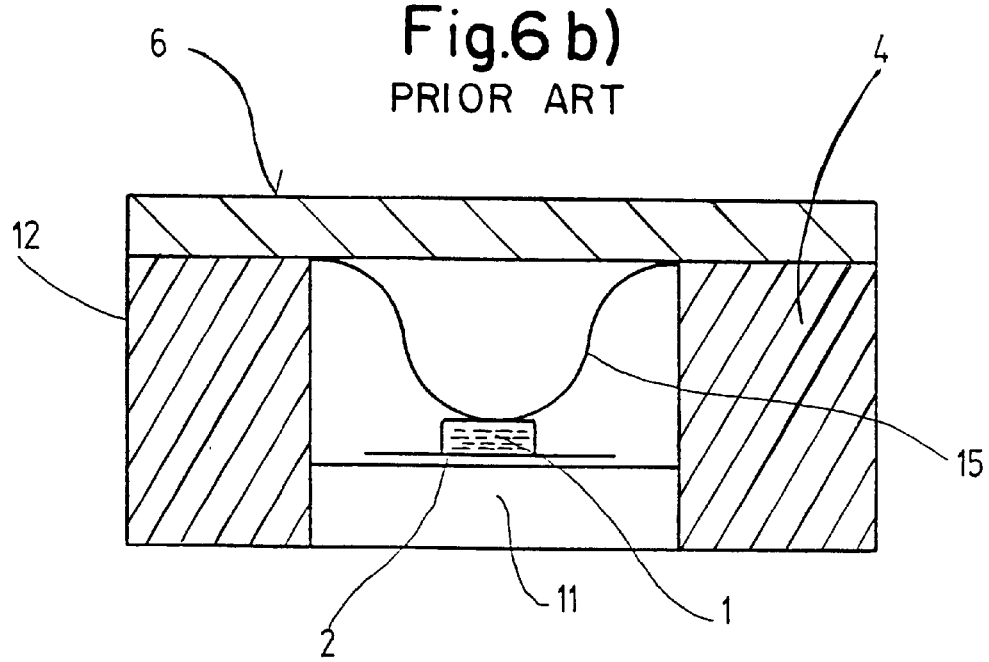

The spring arms can be formed so that they are plastically deformed once, for example during a joining process, but still have a sufficient elasticity which guarantees a reliable contact with the Gunn element. A Gunn element which is packed in the housing 12 in accordance with the present invention can be for example a conventional Gunn diode element, as a core piece of a Gunn oscillator shown in FIG. 5, for example for a distance radar used in a motor vehicle. The contact safety is improved when compared with the conventional diode housing, and the manufacturing process and the handling are substantially simplified.

It will be understood that each of the elements described above, or two or more together, may also find a useful application in other types of constructions differing from the types described above.

While the invention has been illustrated and described as embodied in housing for electronic component, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is:

1. A housing for an electronic component, comprising a bottom part; a wall part; a cover part which together are adapted to cover the electronic component; a contact spring provided on said cover part for producing an electrical connection with a terminal of the component; said cover part and said contact spring being formed as a one-piece integral element, said contact spring at its side adapted to face the component being provided with a contact seal.

2. A housing as defined in claim 1, wherein said cover and said contact spring are formed as a one-piece integral element produced by galvanic metal deposition.

3. A housing as defined in claim 1, wherein said contact seal is composed of gold.

4. A housing as defined in claim 1, wherein said contact spring has at least two elastic spring arms.

5. A housing as defined in claim 1, wherein said contact spring has a spring force which is selected so as to provide contacting of the component over its service life.

6. A housing as defined in claim 5, wherein said contact spring is formed as an element which is plastically deformed and still maintains its elastic deformability.

7. A housing as defined in claim 1, wherein said contact spring is composed of a material selected from the group consisting of nickel and a nickel alloy.

8. A housing as defined in claim 1, wherein said contact spring is positioned in said cover part so that during closing of the housing, by means of said cover part the electronic component is contacted.

9. A housing as defined in claim 1, wherein said bottom part, said wall part, and said cover part hermetically close an inner space of the housing.

10. A housing as defined in claim 1, wherein said bottom part is composed of copper and provides an electrical connection with a further contact of the electronic component and heat withdrawal.

11. A housing as defined in claim 1; and further comprising a spacer composed of gold and arranged so that the electronic component lies on said spacer.

12. A housing as defined in claim 1, wherein said wall part is formed as a ceramic disk.

13. A housing as defined in claim 1, wherein the housing is formed as a housing for covering a Gunn element as an electronic component.

14. A housing for an electronic component, comprising a bottom part; a wall part; a cover part which together are adapted to cover the electronic component; a contact spring provided on said cover part for producing an electrical connection with a terminal of the component; said cover part and said contact spring being formed as a one-piece integral element, said contact spring having at least two elastic spring arms which together form a torsion spring.

15. A housing for an electronic component, comprising a bottom part; a wall part; a cover part which together are adapted to cover the electronic component; a contact spring provided on said cover part for producing an electrical connection with a terminal of the component; said cover part and said contact spring being formed as a one-piece integral element, said wall part being composed of a photo-stucturable glass.

16. A housing for an electronic component, comprising a bottom part; a wall part; a cover part which together are adapted to cover the electronic component; a contact spring provided on said cover part for producing an electrical connection with a terminal of the component; said cover part and said contact spring being formed as a one-piece integral element, said cover and said contact spring being formed as a one-piece integral element produced by galvanic metal deposition, said contact spring being arranged on said cover part as galvanically deposited columns.

17. A housing as defined in claim 16, wherein said columns are applied on a galvanically deposited socket.

18. A housing for an electronic component, comprising a bottom part; a wall part; a cover part which together are adapted to cover the electronic component; a contact spring provided on said cover part for producing an electrical connection with a terminal of the component; said cover part and said contact spring being formed as a one-piece integral element, said cover part and said contact spring being composed of a material selected from the group consisting of nickel and a nickel alloy, and covered with a gold layer.

* * * * *